(12) United States Patent
Lee

(10) Patent No.: US 7,961,535 B2
(45) Date of Patent: Jun. 14, 2011

(54) TEST CIRCUIT AND METHOD FOR USE IN SEMICONDUCTOR MEMORY DEVICE

(75) Inventor: Hi-Choon Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 288 days.

(21) Appl. No.: 12/155,512

(22) Filed: Jun. 5, 2008

(65) Prior Publication Data
US 2009/0003104 A1 Jan. 1, 2009

(30) Foreign Application Priority Data

Jun. 26, 2007 (KR) .................. 10-2007-0062719

(51) Int. Cl.
*G11C 7/00* (2006.01)
*G11C 29/00* (2006.01)
(52) U.S. Cl. .................. 365/201; 365/230.03; 365/200
(58) Field of Classification Search .......... 365/201, 365/200, 230.03
See application file for complete search history.

(56) References Cited

U.S. PATENT DOCUMENTS

| 5,467,356 | A | * | 11/1995 | Choi | 714/718 |
| 5,610,866 | A | * | 3/1997 | McClure | 365/201 |
| 6,314,035 | B1 | * | 11/2001 | Kitade et al. | 365/201 |
| 6,333,879 | B1 | * | 12/2001 | Kato et al. | 365/201 |
| 6,352,868 | B1 | * | 3/2002 | Yang | 438/14 |
| 6,502,215 | B2 | | 12/2002 | Raad et al. | |
| 2004/0145933 | A1 | * | 7/2004 | Yamane | 365/45 |
| 2006/0282718 | A1 | | 12/2006 | Perry et al. | |
| 2006/0291308 | A1 | * | 12/2006 | Yusa | 365/201 |

FOREIGN PATENT DOCUMENTS

KR 10-2007-000326 1/2007

* cited by examiner

*Primary Examiner* — Amir Zarabian
*Assistant Examiner* — Kretelia Graham
(74) *Attorney, Agent, or Firm* — Harness, Dickey & Pierce, P.L.C.

(57) ABSTRACT

A test circuit and method for use in a semiconductor memory device is provided. The test method for use in a semiconductor memory device including a plurality of memory blocks may include sequentially enabling a plurality of word lines by applying a stress to the wordlines and performing a test operation, in response to sequentially applied test addresses, each of the word lines being sequentially selected from the plurality of memory blocks and enabled.

13 Claims, 8 Drawing Sheets

FIG.2 (CONVENTIONAL ART)

| RA | A12 | A11 | A10 | A9 | A8 | A7 | A6 | A5 | A4 | A3 | A2 | A1 | A0 |
|---|---|---|---|---|---|---|---|---|---|---|---|---|---|
| WL00 | 0 | 0 | 0 | 0 | 0 | 0 | 0 | 0 | 0 | 0 | 0 | 0 | 0 |
| WL01 | 0 | 0 | 0 | 0 | 0 | 0 | 0 | 0 | 0 | 0 | 0 | 0 | 1 |
| WL02 | 0 | 0 | 0 | 0 | 0 | 0 | 0 | 0 | 0 | 0 | 0 | 1 | 0 |
| WL03 | 0 | 0 | 0 | 0 | 0 | 0 | 0 | 0 | 0 | 0 | 0 | 1 | 1 |
| WL04 | 0 | 0 | 0 | 0 | 0 | 0 | 0 | 0 | 0 | 0 | 1 | 0 | 0 |
| ••• | | | | | | | | | ••• | | | | |
| WL0511 | 0 | 0 | 0 | 0 | 1 | 1 | 1 | 1 | 1 | 1 | 1 | 1 | 1 |
| WL10 | 0 | 0 | 0 | 1 | 0 | 0 | 0 | 0 | 0 | 0 | 0 | 0 | 0 |
| WL11 | 0 | 0 | 0 | 1 | 0 | 0 | 0 | 0 | 0 | 0 | 0 | 0 | 1 |
| ••• | | | | | | | | | ••• | | | | |

FIG. 6

|  | A12 | A11 | A10 | A9 | A8 | A7 | A6 | A5 | A4 | A3 | A2 | A1 | A0 |
|---|---|---|---|---|---|---|---|---|---|---|---|---|---|
| WL00 | 0 | 0 | 0 | 0 | 0 | 0 | 0 | 0 | 0 | 0 | 0 | 0 | 0 |
| WL10 | 0 | 0 | 0 | 1 | 0 | 0 | 0 | 0 | 0 | 0 | 0 | 0 | 0 |
| WL20 | 0 | 0 | 1 | 0 | 0 | 0 | 0 | 0 | 0 | 0 | 0 | 0 | 0 |
| WL30 | 0 | 0 | 1 | 1 | 0 | 0 | 0 | 0 | 0 | 0 | 0 | 0 | 0 |
| WL40 | 0 | 1 | 0 | 0 | 0 | 0 | 0 | 0 | 0 | 0 | 0 | 0 | 0 |
| ··· | ··· | ··· | | | | | | | ··· | | | | |
| WL150 | 1 | 1 | 1 | 1 | 0 | 0 | 0 | 0 | 0 | 0 | 0 | 0 | 0 |
| W01 | 0 | 0 | 0 | 0 | 0 | 0 | 0 | 0 | 0 | 0 | 0 | 0 | 1 |
| W11 | 0 | 0 | 0 | 1 | 0 | 0 | 0 | 0 | 0 | 0 | 0 | 0 | 1 |
| ··· | | | ··· | | | | | | ··· | | | | |

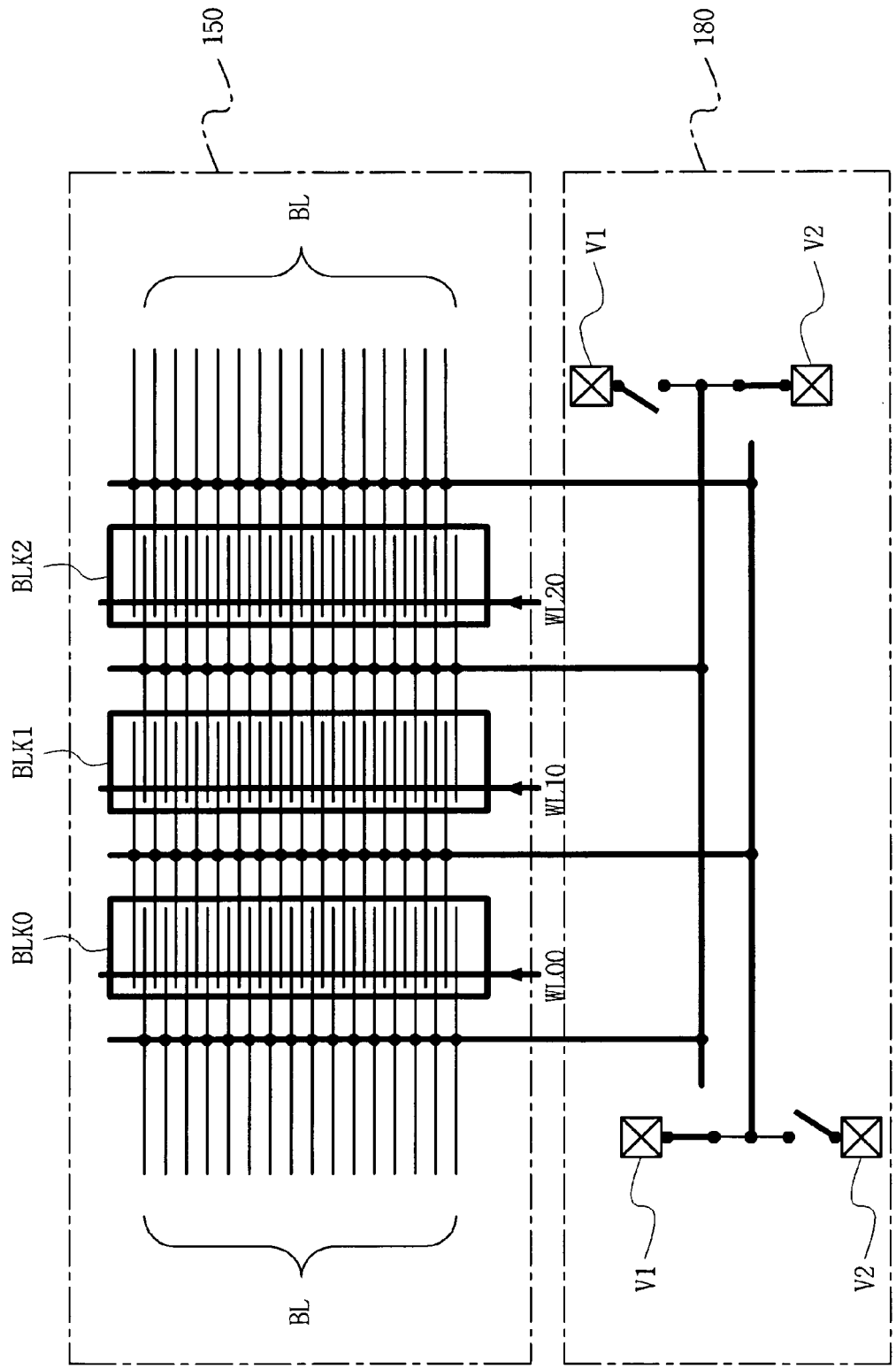

TEST CIRCUIT AND METHOD FOR USE IN SEMICONDUCTOR MEMORY DEVICE

PRIORITY STATEMENT

This application claims priority under 35 U.S.C. §119 to Korean Patent Application No. 10-2007-0062719, filed on Jun. 26, 2007, in the Korean Patent Office, the entire contents of which are incorporated herein by reference.

BACKGROUND

1. Field

The example embodiments relate to semiconductor memory devices, and more particularly, to a test circuit and a method for use in a semiconductor memory device, for sequentially selecting word lines from different memory blocks.

2. Description of Related Art

As the degree of integration of devices within a semiconductor memory device gradually increases, the size of circuit devices adapted within the semiconductor memory device may become relatively smaller and fabrication processes of semiconductor memory devices used for fabricating the circuit devices may become very complicated. Thus, a process margin may decrease, and may bring about an increase of failed memory cells.

When fabrication processes of a semiconductor memory device are completed, a test for the semiconductor memory devices may be performed prior to starting a sawing process as part of a packaging process. The test may be performed to check several characteristics of respective semiconductor memory devices formed on a semiconductor substrate.

Semiconductor memory devices may be tested to find failure in the fabrication process of a semiconductor substrate, the assembly process, or other processes. The failure may then be eliminated by selecting only nondefective devices.

When a fabrication failure or inconsistency between design and actual function is found out in the test result of the semiconductor memory devices, an analysis may be executed to detect the exact causes of the failure, and the throughput of semiconductor memory devices may be increased.

A test method may include providing an applied voltage of a semiconductor memory device higher than an actual use voltage, or operating the semiconductor device in a relatively high temperature. This method may be used to apply in advance a stress to the semiconductor memory device for a short time. The stress may correspond to a failure period that may be experienced in an actual use of the device, and may allow memory cells that have a higher possibility of failure to be identified before products are shipped. An electrical test like the one discussed above may be effective in increasing the reliability of products.

This test may be classified as a wafer burn-in test or a package burn-in test according to the test method.

The wafer burn-in test may be used to initially eliminate defective devices by applying a high voltage to a chip of wafer state, and the package burn-in test may be used to initially remove defectives by applying a high voltage to a chip of package state.

Conventional semiconductor memories may have undergone burn-in tests several times in a package state. The burn-in test may be used to guarantee the life and reliability of semiconductor memory devices completed in the fabrication by manufacturers.

Memory devices may be shipped for users after such test procedures. Defects from the test result may be detected mainly in a memory cell array. Causes of these defects may be as follows.

An access transistor constituting a unit memory cell of a general DRAM may be constructed of an NMOS transistor. A gate signal controlling the access transistor in an access operation, which may be high voltage, may be applied as a word line voltage. There may be a high possibility of damaging a gate oxide of the access transistor due to the stress which may result from the strong electric field which may be generated by the word line voltage having a high voltage level. Furthermore, defects may be caused in many peripheral circuits or a core part like, for example, a sense amplifier and equalizing circuit etc.

FIG. 1 illustrates a cell array structure of a general semiconductor memory device according to a conventional art.

A semiconductor memory device referred to in FIG. 1 comprises a plurality of memory banks, for example, four banks, and each memory bank may comprise plural memory blocks BLK0~BLKn, wherein n may be a natural number greater than 1.

The memory blocks BLK0~BLKn may be constructed of, for example, 16 or 32 blocks. Each memory block BLK0~BLKn may comprise a plurality of word lines, for example, an m-number of WL00~WL0m for a zeroth memory block, m being a natural number greater than 1, a plurality of bit lines, and a plurality of memory cells that may be located on intersections of the word lines WL and the bit lines BL.

FIG. 1 illustrates a plurality of memory blocks which may constitute the memory cell array. The memory blocks BLK0~BLKn may constitute one bank of memory cells in a memory cell array or an entire memory cell array.

FIG. 2 is a table illustrating an example generation sequence of test addresses in a semiconductor memory device having a memory cell array structure shown in FIG. 1.

In the example depicted in FIG. 2, the number of memory blocks BLK is 16 and the number of word lines WL in one memory block is 512.

The test address may be constructed of 16 bits including the least significant 13bits A0~A12. With respect to the most significant three bits of the test address, the first and second most significant bits may be an address for a bank selection, and the third most significant bit may be used to indicate when a memory bank selected by the first and second most significant bits is bisected. With respect to the least significant 13 bits, bits A9~A12 may be block addresses to select any one of a plurality of memory blocks within a selected memory bank, and bits A0~A8 may be a line address to select any one of plural word lines within a selected block.

Test addresses are generally generated in an address generating circuit including an address counter.

In the example depicted in FIG. 2, a memory bank etc. is already selected, thus the most significant three bits of the test address are not shown in FIG. 2.

As shown in FIG. 2, 13-bit test address RA of A0~A12 may be generated sequentially increasing from a line address A0~A8. That is, the address may be generated sequentially increasing from '0000 000000000' to '0000 111111111'. Thus all of the 512 word lines WL00~WL0511 of zeroth memory block BLK0 may be sequentially selected and enabled. If a block address A9~A12 increases by one, a counting of line address A0~A8 may restart. That is, test address may be generated and may be sequentially changed from '0001 000000000' to '0001 111111111'. The test addresses RA may be generated through such method from '0000 000000000' to '1111 111111111'.

FIG. 3 illustrates timings for a burn-in test operation according to the conventional art.

Referring to FIG. 3, an active command ACT and a test address RA may be applied in response to a first rising edge of test clock signal CLK. A zeroth word line WL00 of a zeroth memory block BLKO may be enabled in response to the test address RA. Then, a write command Write for the zeroth word line WL00 of the zeroth memory block BLKO may be applied in response to a second rising edge of the test clock signal CLK. A stress operation applied to all memory cells or at least one memory cell coupled to the zeroth word line WL00 may be performed in response to the write command Write. For the purpose of simplicity, only the least significant 3 bits of the test address RA are shown in FIG. 3.

The applied stress operation may be similar to a general write operation, except that the voltage applied through word line or bit line may be of a higher voltage having a higher level as compared with a normal operation.

When the stress operation is completed, the zeroth word line WL00 of the zeroth memory block BLK0 may be precharged in response to a precharge command PRE. Then, a next word line WL01 of the zeroth memory block BLK0 may be enabled, performing an applied stress operation. Through this operation, all 512 word lines WL0m of the zeroth memory block BLK0 may be enabled and the stress applied operation may be performed. Afterwards, a word line WL1m of the subsequent memory block BLK1 may be enabled and an applied stress operation may be performed. The applied stress operation may continue until all word lines WL of all memory blocks BLK are enabled.

In the general test method described above according to the conventional art, a test for all memory cells within one memory block may be performed, and after that, a test for another memory block may be performed. Further, two or more word lines within one memory block may not be simultaneously enabled. This may be based on a structural problem in semiconductor memory devices. This is why when operations of applying high voltage are performed at the same time, an excess current consumption may be caused.

In a conventional test method, a test may be performed for one word line for a time t1 which may be the time between the enabled time point and the precharged time point of the word line. That is, a long test time and great cost may be required. Furthermore, many semiconductor memory devices connected in parallel may have to be tested simultaneously. Thus, it may be preferable to perform all test procedures together with a sensing operation through a bit line, which may cause an overload on a burn-in test equipment.

SUMMARY

The example embodiments may provide a test circuit and method for using the test circuit in a semiconductor memory device. Test efficiency may increase, and may result in reduced test time and cost. An overload on test equipment may be prevented or substantially reduced.

According to at least one example embodiment, a test method for use in a semiconductor memory device having a plurality of memory blocks, may comprise sequentially enabling a plurality of word lines and applying a stress to the wordlines and then performing a test operation in response to sequentially applied test addresses, respective ones of the word lines being sequentially selected and enabled from the plurality of respective memory blocks.

The word lines may be selected and enabled from respectively different memory blocks. Bit lines in the plurality of memory blocks may be biased to a first voltage having a constant level or a second voltage having a level different from the first voltage.

Of the bit lines, mutually adjacent bit lines may be biased to voltages of different levels, and the first voltage may have a level of power source voltage, and the second voltage may be a ground level.

The test address may comprise a block address to select any one of the plurality of memory blocks, and a line address to select any one of plural word lines within a selected memory block. The selection of word lines may comprise locking the line address, and sequentially changing the block address and applying the block address, and so sequentially selecting word lines of all memory blocks in response to the line address; changing the line address by one bit and performing the locking; and repetitively changing the line address until all the word lines have been selected.

The word lines may be configured so that from an enabled time point of the word lines to a precharged time point of the word lines, no data access operation through bit lines corresponding to the word lines may be performed.

According to an example embodiment, a test method for use in a semiconductor memory device including a plurality of memory blocks may comprise biasing all bit lines within the plurality of memory blocks to a first voltage or a second voltage having a level different from the first voltage, as a test mode starts; sequentially selecting respective ones of word lines from the plurality of respective memory blocks and applying a stress to the word lines in response to sequentially applied test addresses, and then performing a burn-in test.

Of the bit lines, mutually adjacent bit lines may be biased to voltages of different levels. The test address may comprise a block address to select any one of the plurality of memory blocks, and a line address to select any one of plural word lines provided within a selected memory block.

The selection of word lines may comprise locking the line address and sequentially changing the block address and applying it, and then sequentially selecting word lines of all memory blocks in response to the line address; changing the line address by one bit and performing the locking; and repetitively changing the line address until all the word lines have been selected.

According to an example embodiment, a test circuit for use in a semiconductor memory device including a plurality of memory blocks, may comprise a command generator for generating commands necessary for a test in response to a test mode signal; and a test address generator for generating a test address to sequentially select respective ones of test word lines to be tested from the plurality of respective memory blocks, in response to the test mode signal.

The command generator may generate active or precharge commands in response to a test clock signal with a given period. The active commands may be generated every a rising edge time point of the test clock signal, and the precharge commands may be generated after a corresponding active command is generated and then a given stress applied time lapses.

The test address may comprise a block address to select any one of the plurality of memory blocks, and a line address to select any one of plural word lines within a selected memory block. The test address generator may comprise a test address counter operating so that all bits of the block address are sequentially counted for one bit counting period of the line address, the test address counter being for generating a test address that sequentially changes only a block address with a locked line address for a counting period of the line address.

The test address generator may further comprise a clock shifter for shifting, corresponding to a number of clocks cycles, the entire test address generated in the test address counter or portion of it, and outputting it, and then generating a precharge address. The test address generator may further comprise a frequency divider for dividing the test clock signal and supplying the divided test clock signal to the clock shifter or the command generator.

The test circuit may comprise a first/second voltage generator for supplying a first voltage having a constant level or a second voltage having a level different from the first voltage, to all bit lines of the plurality of memory blocks. The first voltage may have a level of power source voltage, and the second voltage may have a ground level.

According to an example embodiment, an address generating circuit for use in a semiconductor memory device having a block address to select any one of a plurality of memory blocks, and a line address as a row address to select any one of plural word lines within a selected memory block, may comprise a test address counter operating so that all bits of the block address may be sequentially counted for one bit counting period of the line address in a test mode, where the test address counter may operate to generate a test address that may sequentially change only a block address with a locked line address for a counting period of the line address; and a normal address counter which may operate so that all bits of the line address are sequentially counted for one bit counting period of the block address in a normal mode, where the normal address counter may operate to generate a normal address that may sequentially change only a line address with a locked block address for a counting period of the block address.

In the configuration according to the example embodiments, test time and cost may be reduced, and may result in increased test efficiency.

BRIEF DESCRIPTION OF THE DRAWINGS

The above and other features and advantages of the example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 2 is a table illustrating a generation sequence of test addresses in a semiconductor memory device having a memory cell array structure shown in FIG. 1.

FIG. 6 is a table illustrating a generation sequence of test addresses in the test address generator of FIG. 5.

FIG. 8 illustrates a bit line bias structure in a test operation according to at least one example embodiment.

DESCRIPTION OF EXAMPLE EMBODIMENTS

Figure 1:
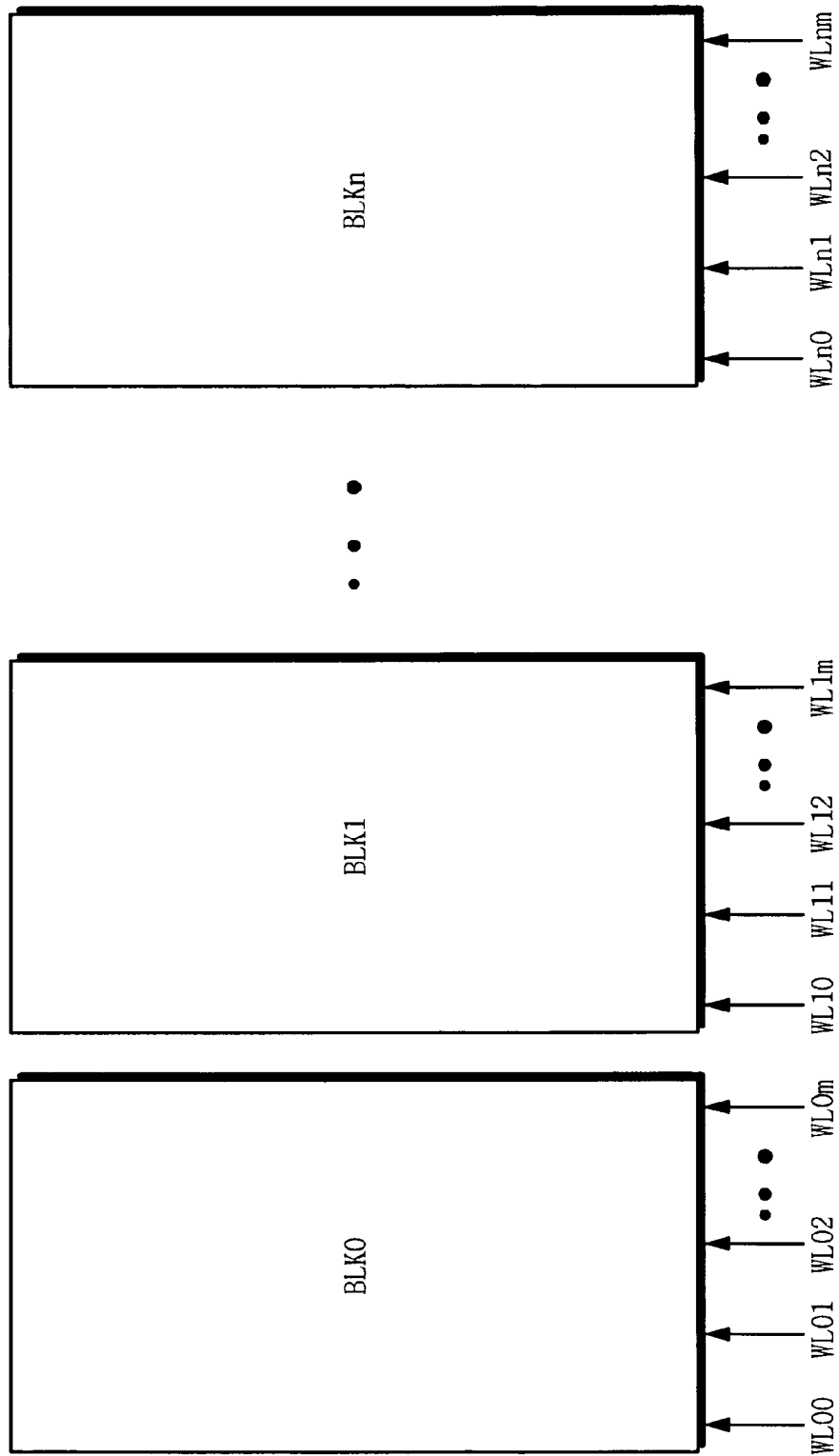
FIG. 1 illustrates a cell array structure of a semiconductor memory device according to the conventional art.

Detailed examples embodiments are disclosed herein. However, specific structural and functional details disclosed herein are merely representative for purposes of describing example embodiments. Example embodiments may, however, be embodied in many alternate forms and should not be construed as limited to only the embodiments set from therein.

Accordingly, while example embodiments are capable of various modifications and alternative forms embodiments thereof are shown by way of example in the drawings and will herein be described in detail. It should be understood, however, that there is not intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are not intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the relevant art. It will be further understood that terms used herein should be interpreted as having a meaning that is consistent with their meaning in the context of this specification and the relevant art and should not be interpreted in an idealized or overly formal sense unless expressly so defined herein. Exemplary embodiments are more fully described below with reference to FIGS. 4 to 8.

Figure 4:
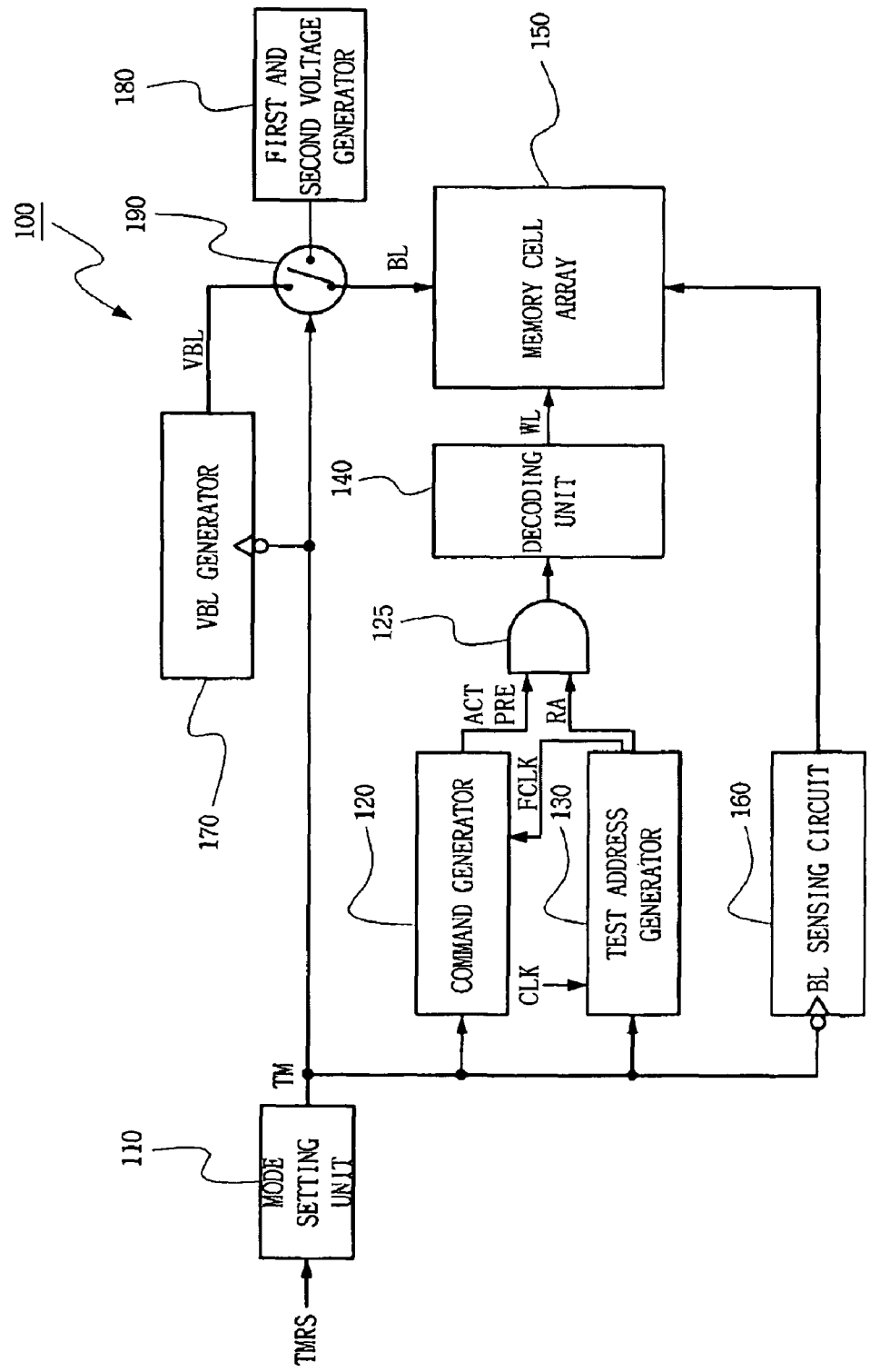
FIG. 4 is a block diagram of a test circuit for use in a semiconductor memory device according to at least one example embodiment.

FIG. 4 illustrates a test circuit 100 of a semiconductor memory device according to at least one example embodiment. The test circuit 100 may be included in a semiconductor memory device. The drawing may omit components that may be well-known to those skilled in the art, for clarity in the description of the example embodiments.

Referring to FIG. 4, a test circuit 100 of a semiconductor memory device according to at least one example embodiment may comprise a mode setting unit 110, command generator 120, test address generator 130, operating unit 125, decoding unit 140, first and second voltage generator 180 and switching unit 190. Alternatively, the test circuit 100 according to at least one example embodiment may include only the command generator 120 and the test address generator 130, and may additionally comprise the first/second voltage generator 180.

The semiconductor memory device may comprise a memory cell array 150 having the structure illustrated and described referring to FIG. 1.

The mode setting unit 110 may set a test mode and a normal mode. For example, when a test MRS (Mode Register Set) signal TMRS is applied, a test mode signal TM may be generated, thus setting the test mode. When the test mode signal TM has a high enable state, the test mode signal may set the test circuit to a test mode, and when the test mode signal TM has a low disable state, the test mode signal may set the test circuit to a normal mode. The test MRS signal may also be provided as the test mode signal TM thereby differentiating the test mode from the normal mode without the operation of the mode setting unit 110.

When the test mode signal TM is enabled, a VBL generator 170 and a BL sensing circuit 160 may be disabled. The VBL generator 170 may be configured to generate a VBL voltage for a precharge of a bit line, and may be configured to operate only in a normal mode, and not in a test mode.

The BL sensing circuit 160 may include circuits related to a memory cell sensing operation through a bit line, which may be circuits related to a data write operation through a bit line. This is why a sensing operation may not be performed in a test operation according to at least one example embodiment. Disabling the BL sensing circuit 160 may disable a control signal to control sensing related circuits. For example, when a bit line sense amplifier is included in the BL sensing circuit 160, disabling the BL sensing circuit 160 may cause the bit line sense amplifier enable signal to be disabled. The BL sensing circuit 160 may also comprise circuits related to a memory cell access through a bit line for a read or write operation.

The command generator 120 may generate commands necessary for a test in response to a test mode signal TM. For example, an active command ACT for an enable of word line and a precharge command PRE for a precharge may be generated. The precharge command PRE may be used to precharge a word line.

The command generator 120 may generate active command ACT every rising edge time point of a test clock signal CLK. Additionally, after a lapse of given time as a stress applied time, the command generator 120 may successively generate an active command ACT at a rising edge time point of the test clock signal CLK and precharge command PRE at a falling edge time point. The test circuit 100 according to at least one example embodiment may perform a consecutive stress applied operation of a word line. A command generating time point may be changed accordingly.

The test address generator 130 may generate a test address RA to sequentially select respective ones of word lines to be tested, from a plurality of respective memory blocks within the memory cell array 150. In other words, test address RA may be generated to sequentially enable plural word lines, that is, test addresses RA may be generated to sequentially select respective ones of test word lines from the plurality of respective memory blocks.

The test address RA may comprise a block address to select any one of the plurality of memory blocks, and a line address to select any one of plural word lines within a selected memory block.

Operation and configuration of the test address generator 130 are described in detail with reference to FIGS. 5 and 6.

The operating unit 125 may perform a logical operation on a command of the command generator 120 and a test address generated in the test address generator 130, and may transmit the result to the decoding unit 140. For example, a test address RA generated in the test address generator 130 may be transmitted to the decoding unit 140 at a time point when a command is generated in the command generator 120.

Alternatively, the command generated in the command generator 120 and the test address RA generated in the test address generator 130 may be directly input to the decoding unit 140 without the operating unit 125. In this case, the decoding unit 140 may be configured to operate only when a command is generated in the command generator 120, or to input the test address RA to the decoding unit 140 only when a command is generated in the command generator 120.

The decoding unit 140 may decode the inputted test address RA and may enable a corresponding word line. The enabled word line may indicate that a high voltage is applied to the word line WL.

The first/second voltage generator 180 may supply a first voltage having a constant level or a second voltage having a level different from the first voltage to all bit lines of the plurality of memory blocks, in response to the test mode signal TM. The first/second voltage generator 180 may operate in a test mode, and may generate and supply a first voltage or second voltage to all bit lines of a memory cell array 150 or tested bit lines. The first/second voltage generator may be configured to supply both the first voltage to a first group of bit lines and the second voltage to a second group of bit lines, simultaneously. The first/second voltage generator may be implemented many ways including one unit issuing both first and second voltages or, alternatively, as a first and second unit for issuing first and second voltages, respectively.

Though the first voltage may have a power source voltage (VDD) level and the second voltage may have a ground level. The first voltage or second voltage may be varied to variable voltage levels by a test state or other variables.

The switching unit 190 performs, in a normal mode, a switching operation of supplying a bit line precharge voltage VBL of the VBL generator 170 to bit lines of the memory cell array. In a test mode, the switching unit 190 may perform a switching operation of supplying first or second voltage of the first/second voltage generator 180 to the bit lines.

Alternatively, the VBL generator 170 and the first/second voltage generator 180 may be directly connected with the bit lines without the switching unit 190. When the VBL generator 170 is controlled to operate only in a normal mode and the first/second voltage generator 180 is controlled to operate only in a test mode, the switching unit 190 may not be used.

Figure 5:
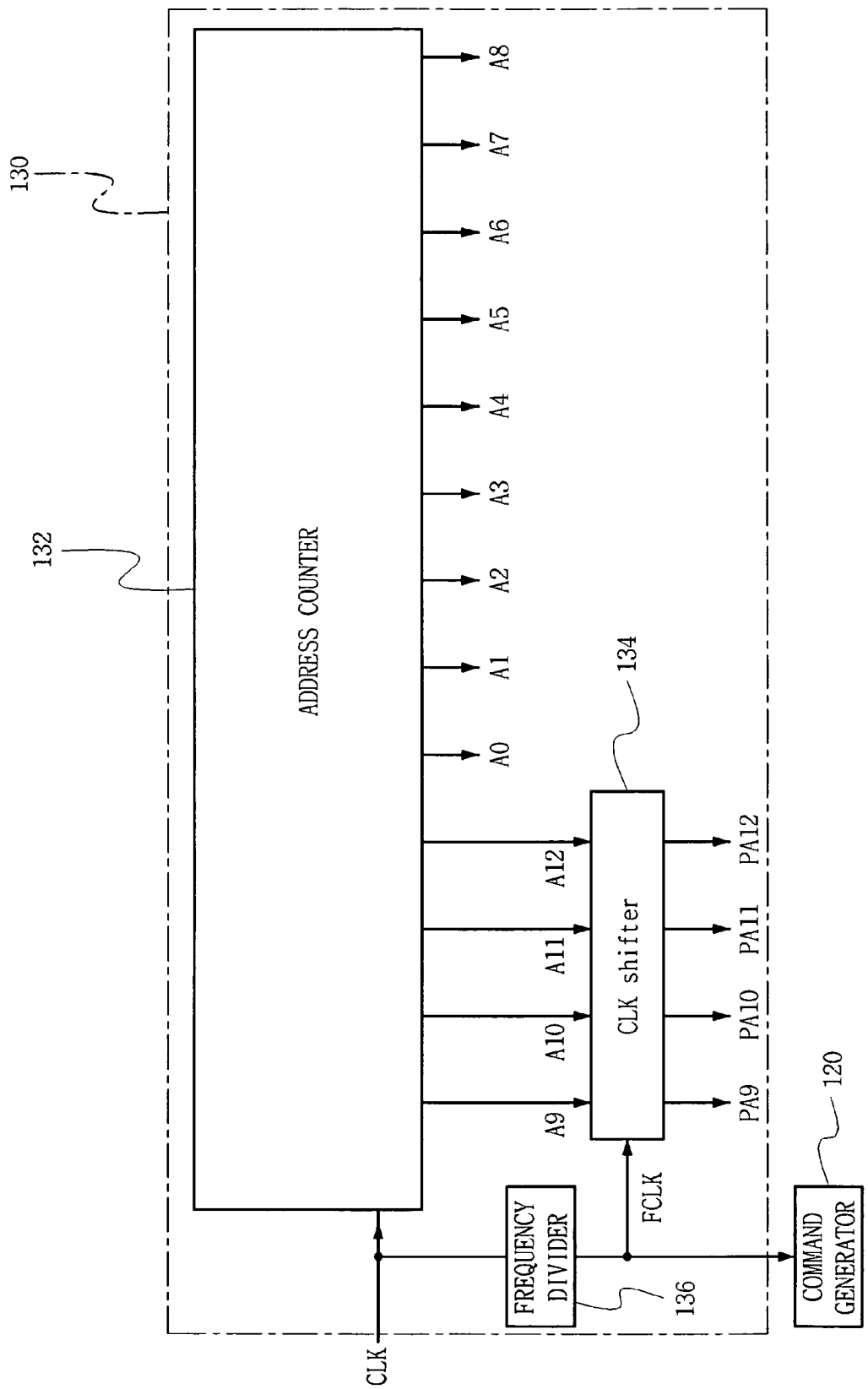
FIG. 5 is a block diagram illustrating in detail a test address generator of FIG. 4 according to at least one example embodiment.

FIG. 5 is a block diagram of test address generator 130 shown in FIG. 4.

As shown in FIG. 5, the test address generator 130 may comprise an address counter 132, clock(CLK) shifter 134 and frequency divider 136.

The address counter 132 may be used as a test address counter for a test operation, and may operate so that all bits of the block address A9~A12 are sequentially counted for one bit counting period of the line address A0~A8, and may generate a test address to sequentially change only a block address A9~A12 with a locked line address A0~A8 for a counting period of the line address A0~A8.

The clock shifter 134 may be provided to generate a precharge address, and may shift a block address generated in the address counter 132. The precharge address PA9~PA12 may be output at a precharge time point of a corresponding word line. Though the clock shifter 134 is described above to shift a block address, it may be configured to shift both the block address and line address.

The frequency divider 136 may divide the test clock signal CLK and may generate a divided clock signal FCLK. In the divided clock signal FCLK, a division rate may be decided to have a frequency necessary for operation of the clock shifter 134 or the command generator 120. For example, the divided clock signal FCLK may have ½ the period of the test clock signal CLK. For example, if a stress applied time to one word line correspond to 8 clock cycles of the test clock signal CLK, the clock shifter 134 may shift the block address by a time corresponding to 17 clock cycles of the divided clock signal, and then output it.

The divided clock signal FCLK may be supplied to the clock shifter 134 or the command generator 120, or both.

FIG. 6 illustrates an example of the addresses generated by the test address generator shown in FIG. 5.

In the example depicted in FIG. 6 the number of memory blocks BLK is 16, and the number of word lines WL within one memory block is 512.

According to at least one example embodiment, the test address may be constructed of 16 bits including the least significant 13 bits A0~A12. With respect to the most significant 3 bits of the test address, the first and second most significant bits may be area addresses to select a memory bank, and the third most significant bit may indicate when a memory bank selected by the first and second most significant bits is bisected. With respect to the least significant 13 bits, bits A9~A12 may be block addresses used to select any one of a plurality of memory blocks within a selected memory bank, and A0~A8 may be line address to select any one of plural word lines within a selected block.

In the example depicted in FIG. 6, a memory bank etc. has already been selected. Thus the three most significant bits are not shown.

With reference to FIG. 6, 13-bit test address RA of A0~A12 may be generated so that block address A9~A12 sequentially increases by one bit and a line address A0~A8 is locked. That is, after a 1-bit increase of '0000 000000000' to '0001 000000000', block address A9~A12 sequentially increases continuously until becoming '1111 000000000'. Accordingly, word lines of specific position, for example, zeroth word lines WL00~WL150 of each memory block, may be sequentially enabled.

Then, block address A9~A12 may be counted again starting with the first value, and line address A0~A8 may be increased by one bit. That is, a test address may be generated, and may be changed from '0000 000000001' to '1111 000000001' sequentially. Through the operations described above, the test address RA may be generated from '0000 000000000' to '1111 111111111'.

Test address generation according to at least one example embodiment may be differentiated from the conventional art at least because a line address sequentially increases while a block address is locked according to conventional art, but according to at least one example embodiment, a block address may be varied while a line address may be locked.

Figure 3:
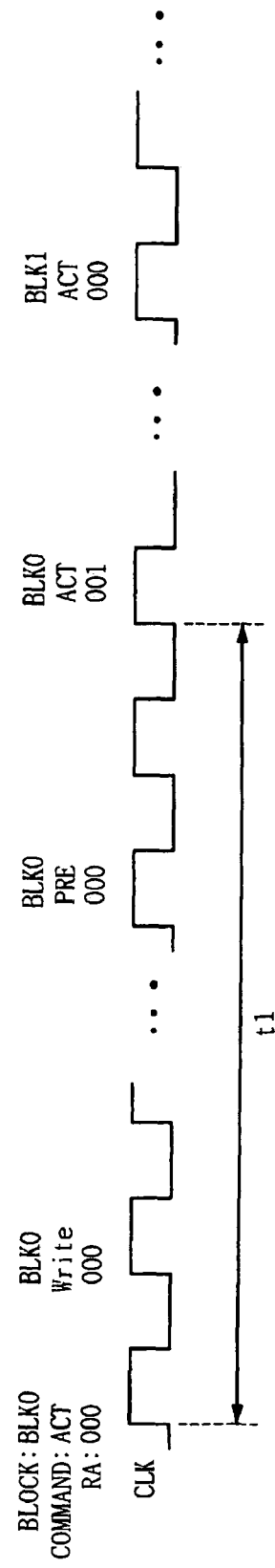
FIG. 3 illustrates timings for a test operation according to the conventional art.

Thus, without the need to create a specific address counter for generating the test address, an output of a general address counter described above referring to FIGS. 2 and 3 may be applied to an address counter according to the example embodiments, thereby realizing an address counter capable of obtaining a function like in FIGS. 5 and 6 through the general address counter. For example, the line address bits A0~A3 of FIG. 3 may be designated as block address bits A9~A12 of FIG. 6, and the remaining address bits A4~A12 of FIG. 3 may be designated as line address bits A0~A8 of FIG. 6, thus realizing the address counter capable of performing the function of FIG. 6. Accordingly, it may be possible to operate in a test mode by controlling a portion of output of a general address counter without the need to create a specific address counter.

Figure 7:
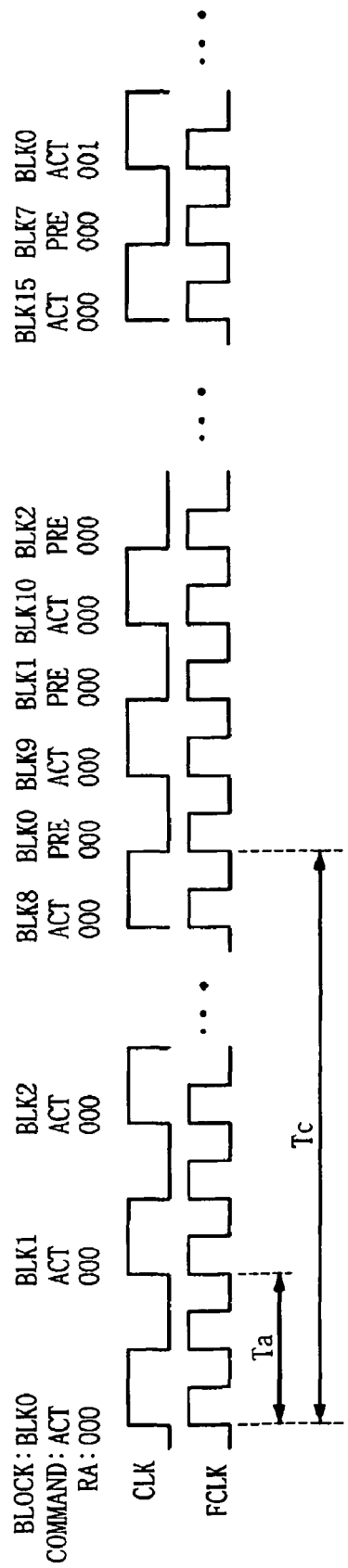
FIG. 7 illustrates timings for test operation of a semiconductor memory device according to at least one example embodiment.

FIG. 7 illustrates timings for a burn-in test operation of a semiconductor memory device according to at least one example embodiment. In the example depicted in FIG. 6, divided clock signal FCLK may have a clock cycle ½ the length Ta of the test clock signal CLK, and a stress applied time may correspond to 17 clock cycles on the divided clock signal FCLK. In the stress applied operation, a higher voltage having a level higher than a level of a normal operation may be applied to a word line WL selected by a test address, thereby performing an enable operation. In the stress applied operation according to example embodiments, a write command may not be applied unlike the conventional art.

As shown in FIG. 7, active command ACT and test address RA may be applied in response to a first rising edge of the test clock signal CLK. First, a zeroth word line WL00 of a zeroth memory block BLK0 may be enabled in response to the test address RA. Then, a zeroth word line WL10 of the first memory block BLK1 may be enabled in response to a second rising edge of the test clock signal CLK.

Word lines WL corresponding to the same line address may be sequentially enabled at every rising edge time point of the test clock signal CLK for each block address. When an enable operation on a zeroth word line WLn0 is performed by a unit of a memory block, an enable operation may be sequentially performed on first to m-th word lines.

A precharge operation for the enabled word line may be performed specifically from the enable operation. A precharge command for a zeroth word line WL00 of the zeroth memory block BLK0 may be applied at a time point when a stress applied time Tc expires, thus performing a precharge for zeroth word line WL00 of the zeroth memory block BLK0. Then, the precharge command PRE may be generated for every falling edge time point of the test clock signal CLK, and a precharge operation for the sequentially enabled word lines may be implemented.

As described above, a precharge address PA for the precharge operation may be generated by the clock shifter 134.

Through the stress applied operation, or test operation, described above according to the example embodiments; a test time may be substantially reduced as compared with a conventional test time. In the conventional art, only one word line is tested at a stress applied time t1, or Tc, but according to the example embodiments, a test for plural word lines can be performed. For example, a test for eight word lines can be performed in FIG. 7. That is, testing may be preformed 8 times faster than the conventional art.

FIG. 8 illustrates a level state of bit lines in performing the test of FIG. 4 according to at least one example embodiment.

As shown in FIG. 8, a plurality of memory blocks BLK0, BLK1 and BLK2 may be included within a memory cell array 150, and word lines WL0, WL10 and WL20, and bit lines BL may be provided as well.

The bit lines BL are biased to a first voltage V1 or second voltage V2 in a test mode. Each of bit lines BL may be biased to the first voltage V1 or the second voltage V2. Additionally, of the bit lines BL, adjacent bit lines may be biased to voltages of different levels. In other words, as shown in FIG. 8, adjacent bit lines BL within one memory block, i.e., BLK0, may alternately have the first voltage V1 and the second voltage V2.

The first and second voltages V1 and V2 may be generated in the first/second voltage generator 180. The first voltage may have a power source voltage (VDD) level, and the second voltage V2 may have a ground level VSS. The power source voltage (VDD) level may be used for a test, and may have a level higher than a power source voltage level of a normal operation.

The biasing of bit lines BL may be performed to substitute a bit line sensing operation or write operation performed in a conventional test operation. In other words, a write operation may be required as a stress applied operation through a bit line in the conventional art, but according to at least one example embodiments, a stress applied operation through the bit lines may function through the biasing of bit lines BL. Accordingly, the biasing of the bit line BL may be performed more simply as compared with a conventional stress applied operation.

According to at least one other example embodiment, different from the example embodiments described referring to FIGS. 4 to 8, word lines may be enabled through the method described above referring to FIGS. 4 to 8, using the method of applying a write command like in the conventional art. In addition, according to at least one other example embodiment, word lines may be enabled through the method described above, employing a method of simultaneously performing a precharge operation of a given number of word lines. For example, when eight word lines have a sequential enabled state, these eight word lines may be precharged at the same time.

As described above, according to some example, a stress can be applied to a capacitor of memory cell, only through the test method of enabling word lines without a sensing operation of bit lines, which may lessen the maximum current level of test equipment and may address a current limit problem that may exists when performing many simultaneous tests. Additionally, test time may be substantially reduced, and a test may be executed with only a clock by using an internal command generator and a counter, which may reduce the number of input/output pins needed for the equipment. Tests may be more efficient and test costs may be reduced.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A test method for use in a semiconductor memory device having a plurality of memory blocks, the method comprising:
sequentially enabling a plurality of word lines by applying a stress to the wordlines and performing a test operation, in response to sequentially applied test addresses, respective ones of the word lines being sequentially selected from the plurality of respective memory blocks and enabled,
wherein applying the stress to the word lines includes applying a voltage to the word lines greater than a voltage associated with a write command during a normal operation of the semiconductor memory device,
wherein each of the sequentially applied test addresses comprises a block address to select any one of the plurality of memory blocks, and a line address to select any one of plural word lines within a selected memory block,
wherein the selecting of the word lines includes
locking the line address and sequentially changing the block address and then applying the block address, and sequentially selecting word lines from each of the plurality of memory blocks in response to the line address,
changing the line address by one bit and performing the locking, and repetitively changing the line address until all word lines have been selected, and
wherein from an enabled time point of the word lines to a precharged time point of the word lines, no data access operation through bit lines corresponding to the word lines may be performed.

2. The method of claim 1, wherein for each selected wordline, the word line and the previously selected wordline are selected from different memory blocks.

3. The method of claim 1, wherein bit lines in the plurality of memory blocks are biased to a first voltage having a constant level or a second voltage having a level different from the first voltage.

4. The method of claim 3, wherein of the bit lines, mutually adjacent bit lines are biased to voltages of different levels.

5. The method of claim 4, wherein the first voltage has a level of power source voltage, and the second voltage has a ground level.

6. A test method for use in a semiconductor memory device including a plurality of memory blocks, the method comprising:
biasing all bit lines within the plurality of memory blocks to a first voltage or second voltage having a level different from the first voltage, as a test mode starts; and
sequentially selecting respective ones of word lines from the plurality of respective memory blocks and applying a stress to the word lines in response to sequentially applied test addresses, and performing a burn-in test,
wherein applying the stress to the wordlines includes applying a voltage to the wordlines greater than a voltage associated with a write command during a normal operation of the semiconductor memory device,
wherein the each of the sequentially applied test addresses comprises a block address to select any one of the plurality of memory blocks, and a line address to select any one of plural word lines provided within a selected memory block,
wherein the selecting of word lines includes
locking the line address and sequentially changing the block address and then applying the block address, and then sequentially selecting word lines of each of the plurality memory blocks in response to the line address,
changing the line address by one bit and performing the locking, and
repetitively changing the line address until all word lines have been selected, wherein from an enabled time point of the word lines to a precharged time point of the word lines, no data access operation through bit lines corresponding to the word lines may be performed.

7. The method of claim 6, wherein of the bit lines, mutually adjacent bit lines are biased to voltages of different levels.

8. A test circuit for use in a semiconductor memory device including a plurality of memory blocks, the circuit comprising:
- a command generator for generating commands for a test in response to a test mode signal;
- a test address generator for generating a test address to sequentially select respective ones of test word lines to be tested from the plurality of respective memory blocks, in response to the test mode signal; and
- a voltage generator for supplying a first voltage having a constant level or a second voltage having a level different from the first voltage to all bit lines of the plurality of memory blocks,
- wherein the test address comprises a block address to select any one of the plurality of memory blocks, and a line address to select any one of plural word lines provided within a selected memory block,
- wherein the test address generator comprises a test address counter configured to operate so that all bits of the block address are sequentially counted for one bit counting period of the line address, the test address counter being configured so that during the counting period of the lines address, the test address generator generates the test address by sequentially changing only the block address with the line address being locked, and
- wherein the test address generator further comprises a clock shifter for shifting, corresponding to a number of clock cycles, at least a portion of the bits of the test address, outputting the shifted bits, and generating a precharge address.

9. The circuit of claim 8, wherein the command generator is configured to generate active or precharge commands in response to a test clock signal, the test clock signal having a period,
the command generator being configured to generate the active commands at every rising edge of the test clock signal, and the precharge commands after a corresponding active command is generated and then a stress applied time lapses.

10. The circuit of claim 8, wherein the test address generator further comprises a frequency divider for dividing the test clock signal and supplying the divided test clock signal to the clock shifter or the command generator.

11. The circuit of claim 8, wherein the first voltage has a level of power source voltage, and the second voltage has a ground level.

12. The circuit of claim 11, wherein of the bit lines, mutually adjacent bit lines are biased to voltages of different levels.

13. The circuit of claim 8, wherein the test mode signal is configured to disable a bit line precharge voltage supply circuit of the semiconductor memory device and an access circuit having a read/write operation.

* * * * *